United States Patent
Chen et al.

(10) Patent No.: US 9,287,233 B2
(45) Date of Patent: Mar. 15, 2016

(54) ADHESIVE PATTERN FOR ADVANCE PACKAGE RELIABILITY IMPROVEMENT

(71) Applicant: Taiwan Semiconductor Manufacturing Co., Ltd., Hsin-Chu (TW)

(72) Inventors: Chin-Liang Chen, Kaohsiung (TW); Wei-Ting Lin, Taipei (TW); Kuan-Lin Ho, Hsinchu (TW); Yu-Chih Liu, Taipei (TW); Chun-Cheng Lin, New Taipei (TW); Shih-Yen Lin, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 32 days.

(21) Appl. No.: 14/093,856

(22) Filed: Dec. 2, 2013

(65) Prior Publication Data
US 2015/0155221 A1    Jun. 4, 2015

(51) Int. Cl.
| | |
|---|---|
| *H01L 23/12* | (2006.01) |
| *H01L 23/34* | (2006.01) |
| *H01L 23/10* | (2006.01) |
| *H01L 23/00* | (2006.01) |
| *H01L 23/42* | (2006.01) |
| *H01L 23/367* | (2006.01) |

(52) U.S. Cl.
CPC ............... *H01L 24/81* (2013.01); *H01L 23/10* (2013.01); *H01L 23/42* (2013.01); *H01L 24/17* (2013.01); *H01L 23/3675* (2013.01); *H01L 23/562* (2013.01)

(58) Field of Classification Search
CPC ......... H01L 23/10; H01L 23/42; H01L 24/17; H01L 24/81
USPC ................................................. 257/704, 707
See application file for complete search history.

(56) References Cited

U.S. PATENT DOCUMENTS

| | | | | |
|---|---|---|---|---|
| 6,967,403 | B2 * | 11/2005 | Chuang et al. ................. | 257/717 |
| 7,271,479 | B2 * | 9/2007 | Zhao et al. ..................... | 257/704 |
| 7,485,496 | B2 * | 2/2009 | Chien et al. .................... | 438/122 |
| 7,579,688 | B2 * | 8/2009 | Noguchi ........................ | 257/712 |
| 7,919,853 | B1 * | 4/2011 | Lee ................................. | 257/706 |
| 2002/0113306 | A1 * | 8/2002 | Kwon et al. .................... | 257/691 |
| 2008/0290502 | A1 | 11/2008 | Kutlu | |

* cited by examiner

*Primary Examiner* — Luan C Thai
(74) *Attorney, Agent, or Firm* — Eschweiler & Associates, LLC

(57) ABSTRACT

The present disclosure relates to an integrated chip package having a plurality of different adhesive layers that provide for a low lid induced stress good warpage control of a substrate and/or IC die, and an associated method of formation. The integrated chip package has an integrated chip (IC) die coupled to an underlying substrate by an electrically conductive interconnect structure. A first adhesive layer, having a first Young's modulus, is disposed onto the substrate at a first plurality of positions surrounding the IC die. A second adhesive layer, having a second Young's modulus different than the first Young's modulus, is disposed onto the substrate at a second plurality of positions surrounding the IC die. A lid is affixed to the substrate by the first and second adhesive layers and extends to a position overlying the IC die.

19 Claims, 6 Drawing Sheets

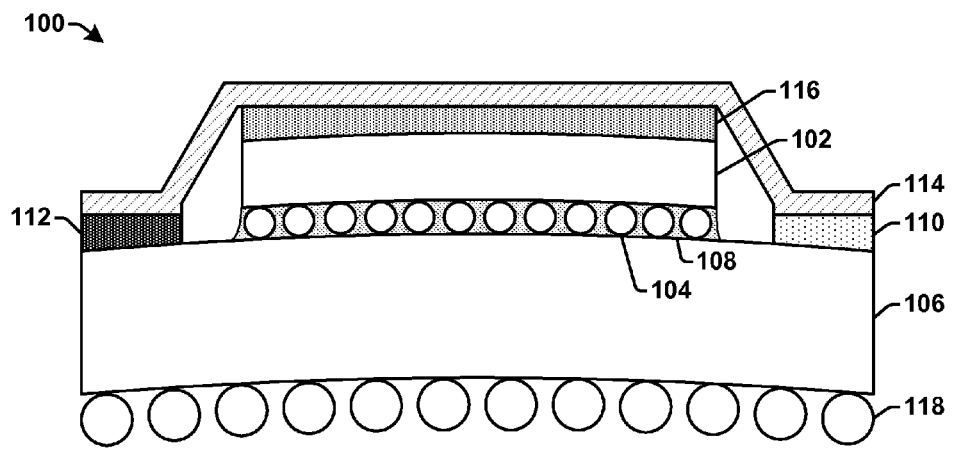
Fig. 1A
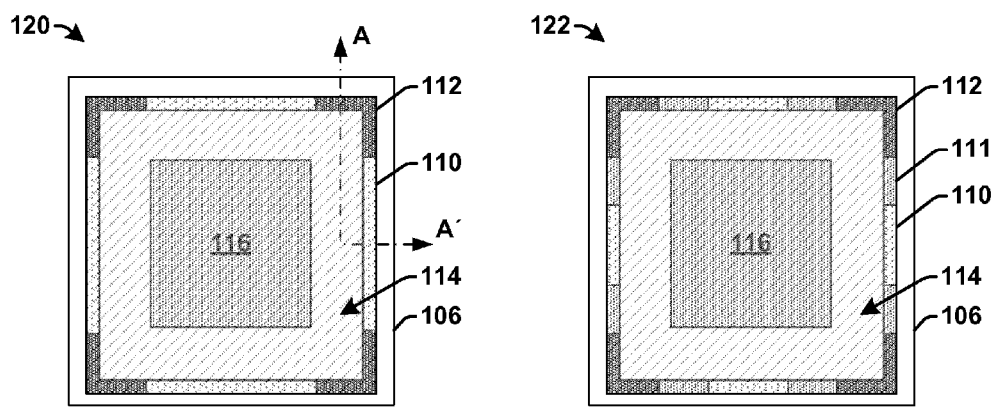
Fig. 1B  Fig. 1C

ADHESIVE PATTERN FOR ADVANCE PACKAGE RELIABILITY IMPROVEMENT

Modern day integrated chips are formed by operating upon a semiconductor wafer using a large number of processing steps (e.g., lithography etching, implantations, depositions, etc.). The processing steps form devices (e.g., transistors) within the semiconductor wafer. Once the processing steps are completed, the semiconductor wafer is diced, or sawed, to separate the semiconductor wafer into a plurality of integrated chip (IC) die, respectively comprising an integrated chip. Each IC die is then packaged, by encasing the IC die in a supporting case, to prevent physical damage and corrosion and to provide for electrical connections between the IC die and a circuit board.

BRIEF DESCRIPTION OF THE DRAWINGS

FIGS. 1A-1B illustrates some embodiments of an integrated chip package comprising a lid affixed to a substrate by a plurality of different adhesive layers.

FIG. 1C illustrates a top-view of some alternative embodiments of an integrated chip package.

DETAILED DESCRIPTION

Figure 2:
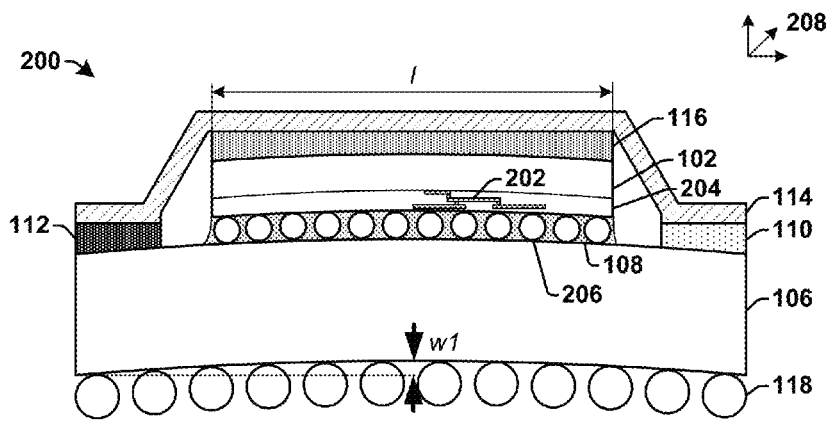
FIG. 2 illustrates some embodiments of a cross-sectional view of a disclosed flip-chip integrated chip package having a lid affixed to a substrate by first and second adhesive layers.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Within a semiconductor package, an integrated chip (IC) die is connected to an underlying substrate by way of one or more electrically conductive bonding structures (e.g., solder balls). The electrically conductive bonding structures are enclosed within an underfill layer that is configured to prevent CTE (coefficient of thermal expansion) mismatch between the IC die and the underlying substrate. A lid is subsequently affixed to the substrate at a position overlying the IC die. The lid is configured to dissipate heat from the IC die.

As the temperature varies, the package may warp (e.g., due to CTE mismatch between materials) and the lid may cause a stress on the substrate and IC die. As the size of an IC die increases, the severity of such problems increase. For example, as the size of an IC die increases, the size of the lid increases and the stress induced by the lid increases. In large die, the stress may be large enough to cause cracks in the underfill layer. Over time the cracks may propagate through the underfill layer to the dielectric and back-end-of-the-line (BEOL) metal interconnect layers of the IC die, thereby causing reliability problems and IC die failure.

The present disclosure relates to an integrated chip package having a plurality of adhesive layers configured to provide for a low lid induced stress and good warpage control of a substrate and/or IC die, and an associated method of formation. The integrated chip package comprises an integrated chip (IC) die coupled to an underlying substrate by a plurality of electrically conductive bonding structures disposed within an underfill layer. A first adhesive layer, having a first Young's modulus, is disposed onto the substrate at a first plurality of positions surrounding the IC die. A second adhesive layer, having a second Young's modulus lower than the first Young's modulus, is disposed onto the substrate at a second plurality of positions surrounding the IC die. A lid is affixed to the substrate by the first and second adhesive layers and is configured to extend to a position overlying the IC die. The lower Young's modulus of the second adhesive layer has a high elasticity that allows for more movement between the lid and the substrate and thereby prevents stress from the lid from causing cracks in the underfill layer, while the higher Young's modulus of the first adhesive layer has a low elasticity that allows for less movement between the lid and the substrate and thereby reduces warpage of the integrated chip package.

FIGS. 1A-1B illustrate some embodiments of an integrated chip package comprising a lid affixed to a substrate with a plurality of different adhesive layers, 110 and 112, configured to mitigate warpage while improving reliability.

FIG. 1A illustrates a cross-sectional view of an integrated chip package 100. The integrated chip package 100 comprises an integrated chip (IC) die 102 comprising a semiconductor substrate having a plurality of semiconductor devices (e.g., transistor devices, passive devices, etc.) that form a functional integrated circuit. In various embodiments, the IC die 102 may comprise any type of semiconductor material (e.g., silicon, silicon germanium, etc.).

The IC die 102 is physically connected to a substrate 106 by way of a plurality of electrically conductive bonding structures 104. In some embodiments, the plurality of electrically conductive bonding structures 104 may comprise solder bumps. In other embodiments, the plurality of electrically conductive bonding structures 104 may comprise copper pillars. The electrically conductive bonding structures 104 are disposed within an underfill layer 108 located between the IC die 102 and the substrate 106. The underfill layer 108 is an electrically non-conductive material configured to prevent CTE mismatch between the IC die 102 and the substrate 106 so that differences in thermal expansion between the IC die 102 and the substrate 106 do not damage the electrically conductive bonding structures 104. In various embodiments, the underfill layer 108 may comprise a moldable underfill comprising a resin or epoxy, for example.

A plurality of different adhesive layers, 110 and 112, respectively comprising different Young's moduli, are disposed onto the substrate 106 at positions surrounding the IC die 102. The plurality of different adhesive layers, 110 and 112, are configured to affix the substrate 106 to a lid 114 that extends to a position overlying the IC die 102. The lid 114 is configured to disperse heat received from the IC die 102. In some embodiments, the lid 114 may comprise a metal material having a high thermal conductivity. For example, the lid 114 may comprise a copper alloy coated with a nickel alloy.

In some embodiments, a thermal interface material (TIM) layer 116 is disposed between the IC die 102 and the lid 114. The TIM layer 116 comprises a material (e.g., a polymer)

with a high thermal conductivity that is configured to conduct heat from the IC die 102 to the lid 114. In some embodiments, the adhesive layers, 110 and 112, may comprise a different material than the TIM layer 116. In other embodiments, the adhesive layers, 110 and 112, may comprise a same material as the TIM layer 116.

FIG. 1B illustrates a top-view 120 of integrated chip package 100 (along line A-A').

As shown in top-view 120, the plurality of adhesive layers, 110 and 112, having different Young's moduli are disposed around a perimeter of the IC die 102. In some embodiments, the plurality of adhesive layers, 110 and 112, may comprise a first adhesive layer 110 having a first Young's modulus $E_1$ and a second adhesive layer 112 having a second Young's modulus $E_2$, different (e.g., lower) than the first Young's modulus $E_1$. The first adhesive layer 110 is located at a first plurality of positions surrounding the IC die 102, while the second adhesive layer 112 is located at a second plurality of positions surrounding the IC die 102. In some embodiments, the first plurality of positions and the second plurality of positions do not overlap.

In some embodiments, the first adhesive layer 110 is located at a first plurality of positions that are in proximity to sides of the IC die 102, while the second adhesive layer 112 is located at a second plurality of positions that are in proximity to corners of the IC die 102. For example, the first adhesive layer 110 may be located at a position intersecting a line drawn from a side of the IC die 102 to a side of the substrate 106, while the second adhesive layer 112 may be located at a position intersecting a line drawn from a corner of the IC die 102 to a corner of the substrate 106.

In some embodiments, the first adhesive layer 110 has a linear "I" shape, while the second adhesive layer 112 has an "L" shape comprising two connected legs disposed in substantially orthogonal directions. In some embodiments, the "L" shape of the second adhesive layer 112 may have legs with a substantially equal length. In other embodiments, the "L" shape of the second adhesive layer 112 may have legs with different lengths.

The lid 114 is disposed at a position connected to the plurality of adhesive layers, 110 and 112. The lid 114 has a rigidity greater than that of the substrate 106 or the IC die 102, such that attaching the lid 114 to the substrate 106 reduces warpage of the substrate 106 and the IC die 102. However, the rigidity of the lid 114 causes a stress on the substrate 106 and IC die 102, which is largest at the corners of the IC die 102.

The use of the plurality of adhesive layers, 110 and 112, reduces the stress on the IC die 102 (relative to packages having a single adhesive layer), while also mitigating warpage of the IC die 102 and the substrate 106. This is because the low Young's modulus (i.e., a high elasticity) of the second adhesive layer 112 at the corner of the IC die 102 allows for more movement between the lid 114 and the substrate 102 during thermal variations. Since the stress induced by the lid 114 is largest at the corners, the second adhesive layer 112 reduces the transfer of stress from the lid 114 to the substrate 106 due to thermal variations, and thereby prevents stress from the lid 114 from causing cracks in the underfill layer 108. The high Young's modulus (i.e., low elasticity) of the first adhesive layer 110 allows for less movement between the lid 114 and the substrate 106 during thermal variations, and thereby prevents warpage of the IC die 102 and the substrate 106. Since the stress induced by the lid 114 is lower at the sides, the first adhesive layer 110 reduces warpage without compromising reliability.

Although FIGS. 1 A-1 B Illustrate an integrated chip die 100 comprising two adhesive layers, 110 and 112, it will be appreciated that the disclosed integrated chip package is not limited to such embodiments. Rather, the disclosed integrated chip package may comprise additional adhesive layers having varying moduli. For example, as shown in top-view 122 of FIG. 1C, the integrated chip package may have a first adhesive layer 110 having a highest modulus located proximate to a center of a side of an IC die 102, an intermediate adhesive layer 111 having a lower modulus located at an adjacent position, and a second adhesive layer 112 having a lowest modulus located proximate to a corner of the IC die 102.

FIG. 2 illustrates a cross-sectional view of some embodiments of a flip-chip integrated chip package 200 having a lid 114 affixed to a substrate by first and second adhesive layers, 110 and 112.

The flip-chip integrated chip package 200 comprises an IC die 102 comprising a plurality of semiconductor devices coupled to a plurality of BEOL (back-end-of-the-line) metal interconnect layers 202 disposed within one or more inter-level dielectric layers 204. The BEOL metal interconnect layers 202 are electrically coupled to a plurality of flip-chip C4 (controlled collapse chip connect) solder balls 206 disposed within an underfill layer 108. The plurality of flip-chip solder balls 206 are placed over a top surface of the IC die 102 (i.e., a surface of the integrated chip die comprising the BEOL metal interconnect layers 202), such that the IC die 102 is placed in an inverted position on a substrate 106. In some embodiments, the substrate 106 may comprise a polymer comprising an enclosed integrated chip.

In some embodiments, the IC die 102 may comprise an area that is greater than 400 mm$^2$. For example, the IC die 102 may have a length l of approximately 20 mm and a width w (not shown), perpendicular to the length l (along direction 208), of approximately 20 mm. The IC die 102 having such a large area uses a lid 114 that induces a relatively large stress on the substrate 106 (e.g., due to CTE mismatch) that may result in cracking of the underfill layer 108 and inter-level dielectric layer 204 of the IC die 102. In other embodiments, the IC die 102 may comprise a smaller area (e.g., less than 400 mm$^2$).

The flip-chip integrated chip package 200 further comprises a first adhesive layer 110 and a second adhesive layer 112 disposed between the substrate 106 and the lid 114. The first adhesive layer 110 may comprise a Young's modulus on the order of gigapascal ($10^9$). For example, the first adhesive layer 110 may have a Young's modulus having a value in a range of between approximately 5 GPa and approximately 10 GPa. In some embodiments, the second adhesive layer 112 may comprise a Young's modulus on the order of megapascal ($10^6$). For example, the second adhesive layer 110 may have a Young's modulus having a value in a range of between approximately 2 MPa and 8 MPa.

A warpage w1 of the flip-chip integrated chip package 200 achieved using the first and second adhesive layers, 110 and 112, is less than the warpage achieved by using a single adhesive layer, such that the use of multiple adhesive layers provides for improved warpage control relative to the use of a single adhesive layer (e.g., a high modulus adhesive or a low modulus adhesive). For example, the use of the first and second adhesive layers, 110 and 112, may reduce the warpage of the flip-chip integrated chip package 200 by approximately 10% relative to a single adhesive layer having a high Young's modulus and may reduce the warpage of the flip-chip integrated chip package 200 by approximately 20% relative to using a single adhesive layer having a low Young's modulus.

Figure 3:
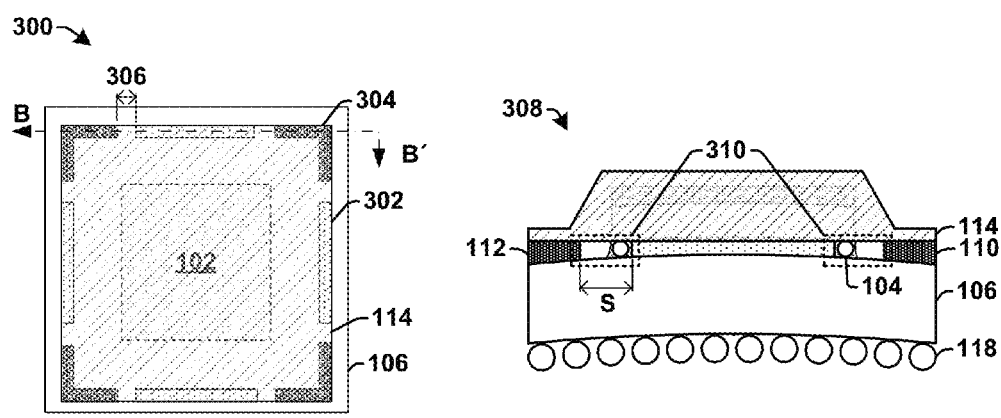
FIG. 3 illustrates some embodiments of an integrated chip package having a lid affixed to a substrate by first and second adhesive layers separated by spaces.

FIG. 3 illustrates a top-view 300 and a corresponding cross-sectional view 302 (along line B-B') of some embodiments of a disclosed flip-chip integrated chip package having two adhesive layers, 302 and 304, separated by spaces 306.

As shown in top-view 300, the flip-chip integrated chip package comprises a first adhesive layer 302 that is separated from a second adhesive layer 304 by spaces 306. The spaces 306 cause the first and second adhesive layers, 302 and 304, to form a discontinuous adhesive path enclosing the IC die 102. In some embodiments, the spaces 306 between adjacent first and second adhesive layers, 302 and 304, may have different sizes. In other embodiments, the spaces 306 between adjacent first and second adhesive layers, 302 and 304, may have substantially equal sizes.

As shown in cross-sectional view 308, by separating the first adhesive layer 302 from the second adhesive layer 304, one or more openings 310 are formed between the lid 114 and the substrate 106. The one or more openings 310 expose the IC die 102 to an ambient environment, thereby allowing for outgassing from a thermal interface material (TIM) layer (e.g., corresponding to TIM layer 116 of FIG. 1A) during formation of the flip-chip integrated chip package.

Figure 4:
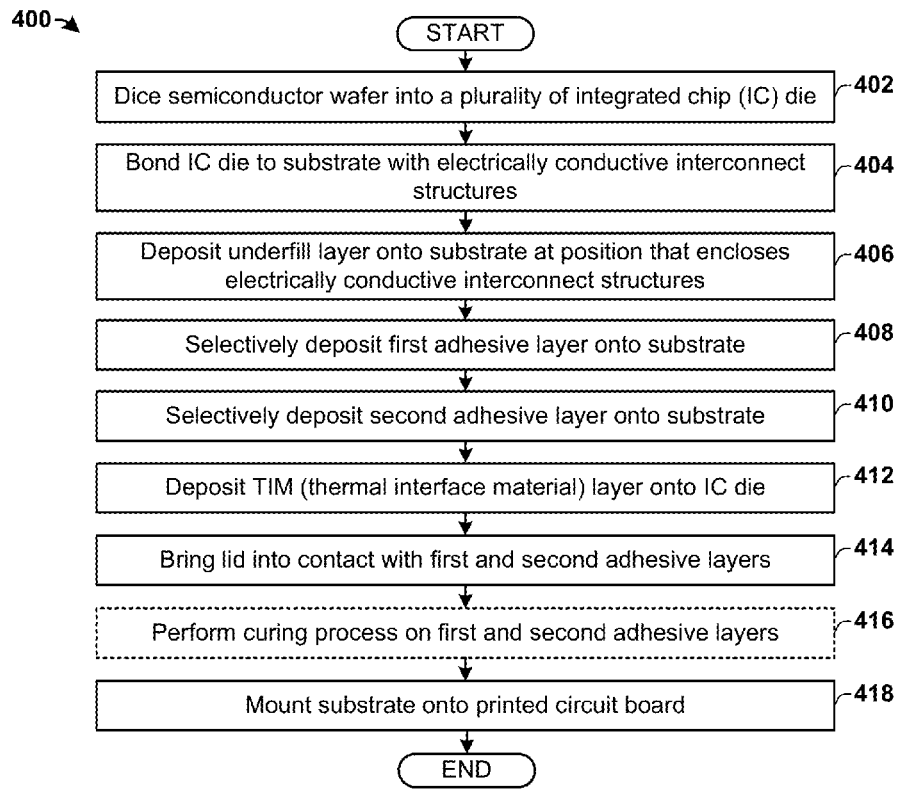
FIG. 4 illustrates a flow diagram of some embodiments of a method of forming an integrated chip package, comprising a plurality of different adhesive layers configured to affix a lid to a substrate.

FIG. 4 illustrates a flow diagram of some embodiments of a method 400 of forming an integrated chip package having a plurality of different adhesive layers configured to affix a lid to a substrate.

While disclosed method 400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, a semiconductor wafer is diced into a plurality of integrated chip (IC) die. Respective IC die comprise a semiconductor substrate having a plurality of semiconductor devices (e.g., transistor devices, passive devices, etc.) that form a functional integrated circuit.

At 404, one of the plurality of IC die is bonded to a substrate using electrically conductive bonding structures. Bonding the IC die to the substrate forms an electrical connection between the IC die and the substrate. In some embodiments, the electrically conductive bonding structures may comprise solder balls or copper pillars.

At 406, an underfill layer is deposited onto the substrate at a position that encloses the electrically conductive bonding structures. The underfill layer is configured to prevent CTE mismatch between the IC die and the substrate so that differences in thermal expansion between the IC die and the substrate do not damage the electrical connection of the electrically conductive bonding structures.

At 408, a first adhesive layer is selectively deposited onto the substrate. In some embodiments, the first adhesive layer may have a first Young's modulus and may be selectively deposited onto the substrate at a first plurality of positions, which are laterally located between a side of the substrate and a proximate side of the IC die.

At 410, a second adhesive layer, different than the first adhesive layer, is selectively deposited onto the substrate. In some embodiments, the second adhesive layer may have a second Young's modulus and may be selectively deposited onto the substrate at a second plurality of positions, which are laterally located between a corner of the substrate and a proximate corner of the IC die. In some embodiments, the second Young's modulus may be less than the first Young's modulus.

At 412, a thermal interface material (TIM) layer is deposited onto the IC die. The TIM layer comprises a material (e.g., a polymer) with a high thermal conductivity that is configured to conduct heat from the IC die to an overlying lid (act 414).

At 414, a lid is brought into contact with the first and second adhesive layers. By bringing the lid into contact with the first and second adhesive layers, the lid is affixed to the substrate.

At 416, a curing process may be performed to cure the first and second adhesive layers. The curing process comprises a high temperature exposure of the first and second adhesive layers that strengths the bond between the lid and the substrate.

At 418, the substrate is mounted onto a printed circuit board (PCB). In some embodiments, the substrate may be mounted onto the printed circuit board using a ball mounting process.

FIGS. 5-11 illustrate some embodiments of a substrate upon which a method of forming an integrated chip package comprising a plurality of different adhesive layers is performed. Although FIGS. 5-11 are described in relation to method 400 it will be appreciated that features of the figures are not limited to such a method, but instead may be stand alone independent of the method.

Figure 5:
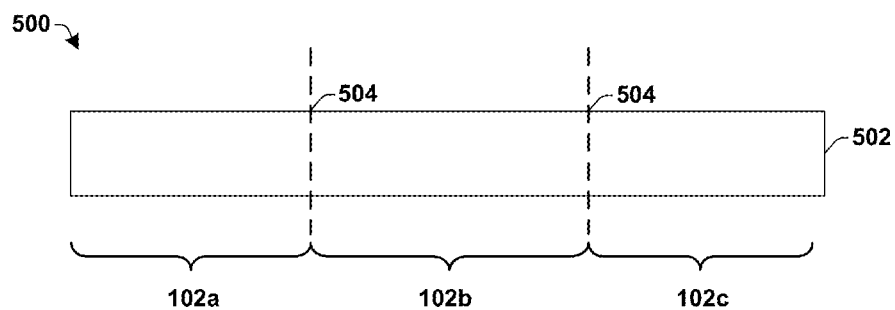
FIGS. 5-11 illustrate some embodiments of a substrate upon which a method of forming an integrated chip package comprising a plurality of adhesive layers configured is performed.

FIG. 5 illustrates a cross-sectional view 500 of some embodiments of a semiconductor wafer corresponding to act 402.

As shown in cross-sectional view 500, a semiconductor wafer 502 is sawed or diced along scribe lines 504 to separate the semiconductor wafer 502 into a plurality of separate IC die 102a, 102b, and 102c. As the semiconductor wafer 502 is diced, a wafer saw removes material from the semiconductor wafer 502 in the area of the scribe lines 504, thereby separating the IC die 102a, 102b, and 102c from one another. In some embodiments, the semiconductor wafer 502 may be diced along scribe lines 504 that are perpendicular to one another to form a plurality of rectangularly shaped discrete IC die 102a, 102b, and 102c.

Figure 6:
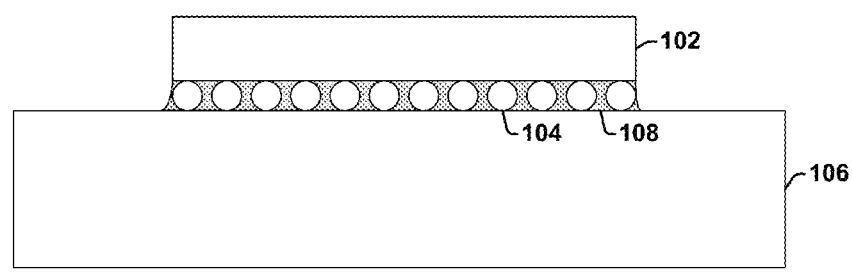

FIG. 6 illustrates a cross-sectional view 600 of some embodiments of a semiconductor substrate corresponding to acts 404-406.

As shown in cross-sectional view 600, one of the plurality of IC die 102 are bonded to a substrate 106 by way of a plurality of electrically conductive bonding structures 104. In some embodiments, the IC die 102 may be bonded to the substrate 106 by way of a flip-chip C4 (controlled collapse chip connect) connection. The flip-chip connection is formed by dispensing solder bumps onto a top surface of the IC die 102 comprising BEOL metal interconnect layers disposed within one or more inter-level dielectric layers. The IC die 102 is then inverted and the solder bumps are brought into contact with the substrate 106. In some embodiments, the remaining space under the IC die 102 is filled with an electrically non-conductive underfill layer 108 configured to prevent CTE mismatch between the IC die 102 and the underlying substrate 106.

Figure 7:
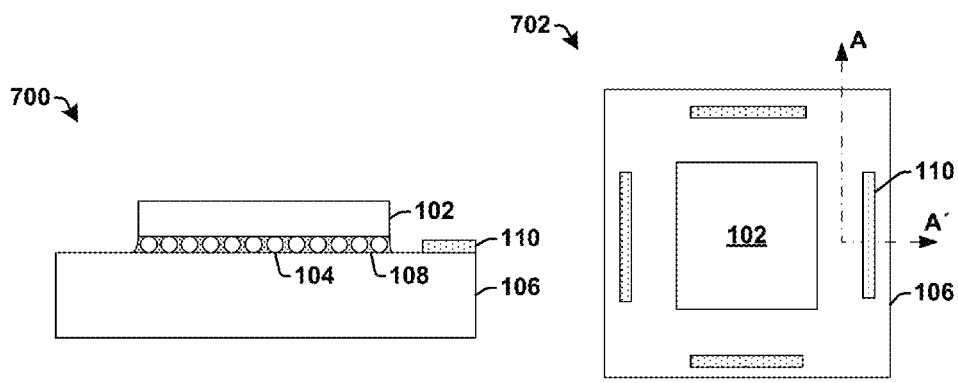

FIG. 7 illustrates a cross-sectional view 700 and a corresponding top-view 702 of some embodiments of a semiconductor substrate corresponding to act 408.

As shown in cross-sectional view 700, a first adhesive layer 110 is selectively deposited onto the substrate 106. The first adhesive layer 110 has a first Young's modulus $E_1$. As shown in top view 702, the first adhesive layer 110 is located at a position in proximity to the sides of the IC die 102. For example, the first adhesive layer 110 may be located at a position intersecting a line drawn from a side of the IC die 102 to a side of the substrate 106.

Figure 8:
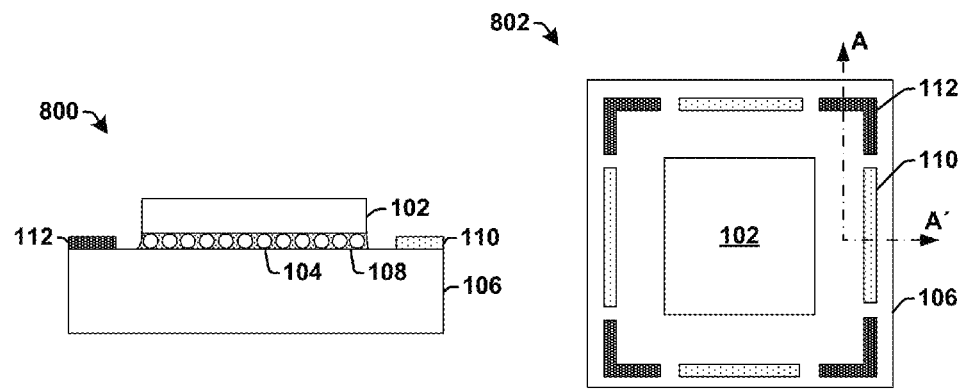

FIG. 8 illustrates a cross-sectional view 800 and a corresponding top-view 802 of some embodiments of a semiconductor substrate corresponding to act 410.

As shown in cross-sectional view 800, a second adhesive layer 112 is selectively deposited onto the substrate 106. The second adhesive layer 112 has a second Young's modulus $E_2$. As shown in top view 802, the second adhesive layer 112 is located at a position in proximity to the corners of the IC die 102. For example, the second adhesive layer 112 may be located at a position intersecting a line drawn from a corner of the IC die 102 to a corner of the substrate 106.

Figure 9:
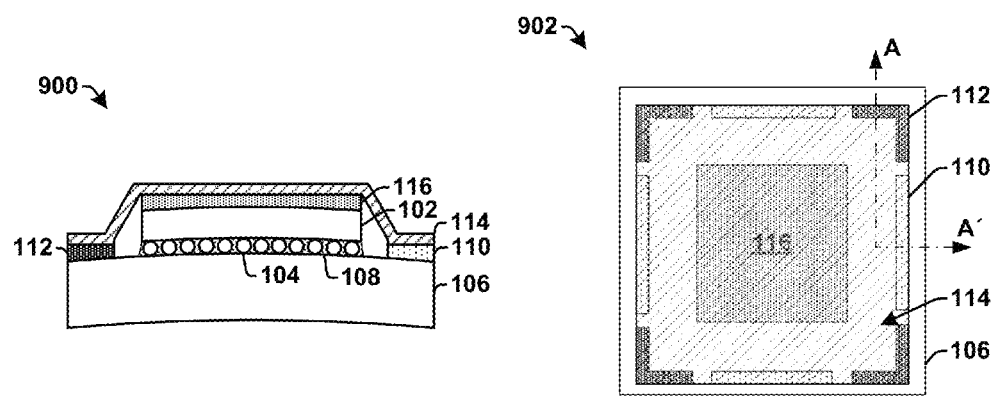

FIG. 9 illustrates a cross-sectional view 900 and a corresponding top-view 902 of some embodiments of a semiconductor substrate corresponding to acts 412-414.

As shown in cross-sectional view 900, a thermal interface material (TIM) layer 116 is deposited onto the IC die 102. The TIM layer 116 is disposed onto a side of the IC die 102 opposite the electrically conductive bonding structures 104. A lid 114 is then brought into contact with the first and second adhesive layers, 110 and 112. By bringing the lid 114 into contact with the first and second adhesive layers, 110 and 112, the lid 114 is affixed to the substrate 106 at a position overlying the IC die 102.

Figure 10:
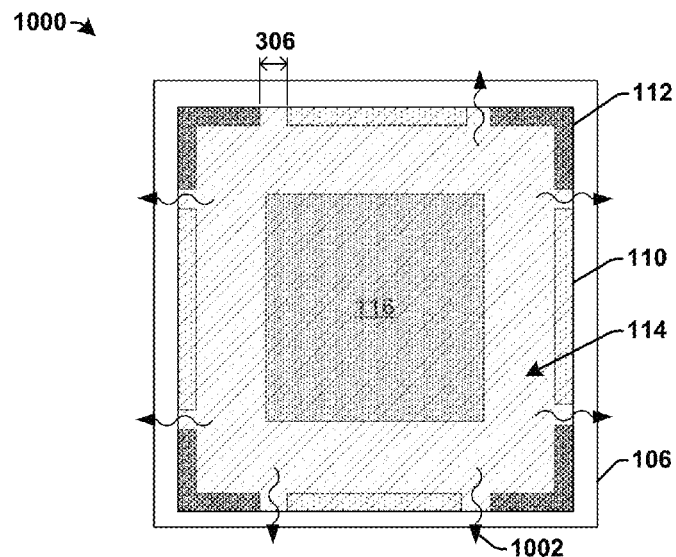

FIG. 10 illustrates a top-view 1000 of some embodiments of a semiconductor substrate corresponding to act 416.

As shown in top-view 1000, after the lid 114 has been brought into contact with the first and second adhesive layers, 110 and 112, a curing process may be performed to strength the bond of the adhesive layers, 110 and 112, between the substrate 106 and the lid 114. The curing process exposes the first and second adhesive layers, 110 and 112, to an elevated temperature.

In some embodiments, the curing process may be performed at a temperature in a range of between approximately 100° C. and approximately 200° C. for a time in a range of between approximately 15 minutes and approximately 90 minutes. In some embodiment, the curing process may cause the TIM layer 116 to generate an outgas 1002. The outgas 1002 may be vented through spaces 306 between the first and second adhesive layers, 110 and 112.

Figure 11:
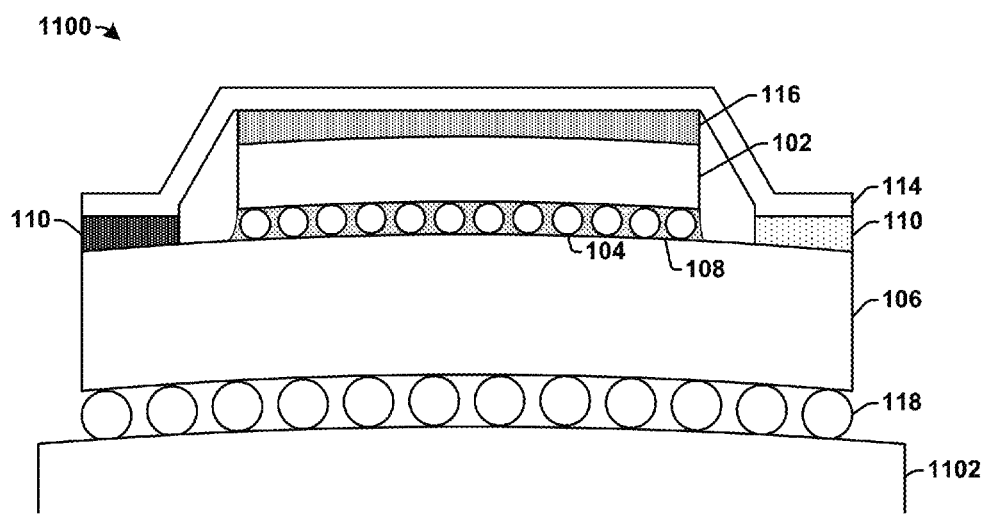

FIG. 11 illustrates a cross-sectional view 1100 of some embodiments of a semiconductor substrate corresponding to act 418.

As shown in cross-sectional view 1100, the substrate 106 is mounted onto a printed circuit board (PCB) 1102. In some embodiments, the substrate 106 may be mounted onto the PCB 1102 using a ball mounting process.

It will be appreciated that while reference is made throughout this document to exemplary structures in discussing aspects of methodologies described herein, that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

The present disclosure relates to an integrated chip package having a plurality of different adhesive layers configured to provide for a low corner stress and good warpage control of a substrate and/or IC die, and an associated method of formation.

In some embodiments, the present disclosure relates to an integrated chip package. The integrated chip package comprises an integrated chip (IC) die coupled to an underlying substrate by a plurality of electrically conductive bonding structures. The integrated chip package further comprises a first adhesive layer having a first Young's modulus and disposed onto the substrate at a first plurality of positions surrounding the IC die, and a second adhesive layer having a second Young's modulus, different than the first Young's modulus, and disposed onto the substrate at a second plurality of positions surrounding the IC die. The integrated chip package further comprises a lid affixed to the substrate by the first and second adhesive layers and configured to extend to a position overlying the IC die.

In other embodiments, the present disclosure relates to an integrated chip (IC) package. The integrated chip package comprises an integrated chip (IC) die coupled to a substrate by a plurality of electrically conductive bonding structures disposed within an underfill layer configured to prevent CTE mismatch between the IC die and the substrate. The integrated chip package further comprises a first adhesive layer having a first Young's modulus and disposed onto the substrate at the first plurality of positions, which are laterally located between a side of the substrate and a proximate side of the IC die, and a second adhesive layer having a second Young's modulus less than the first Young's modulus and disposed onto the substrate at the second plurality of positions, which are laterally located between a corner of the substrate and a proximate corner of the IC die. The integrated chip package further comprises a thermal interface material (TIM) layer disposed between the IC die and the lid, wherein the TIM layer and first and second adhesive layers comprise different materials. The integrated chip package further comprises a lid affixed to the substrate by the first and second adhesive layers and configured to extend to a position overlying the IC die.

In yet other embodiments, the present disclosure relates to a method of forming an integrated chip (IC) package. The method comprises bonding an integrated chip (IC) die to a substrate using a plurality of electrically conductive bonding structures disposed within an underfill layer configured to prevent CTE mismatch between the IC die and the substrate. The method further comprises selectively depositing a first adhesive layer onto the substrate at a first plurality of positions surrounding the IC die, and selectively depositing a second adhesive layer, different than the first adhesive layer, onto the substrate at a second plurality of positions surrounding the IC die. The method further comprises bringing a lid into contact with the first and second adhesive layers.

What is claimed is:

1. An integrated chip (IC) package, comprising:
an integrated chip (IC) die coupled to an underlying substrate by a plurality of electrically conductive bonding structures;
a first adhesive layer having a first Young's modulus and disposed onto the substrate at a first plurality of positions surrounding the IC die;
a second adhesive layer, having a second Young's modulus less than the first Young's modulus, disposed onto the substrate at a second plurality of positions surrounding the IC die, wherein the second adhesive layer has an "L" shape comprising two connected orthogonal legs separated from the first adhesive layer by spaces having different sizes; and
a lid affixed to the substrate by the first and second adhesive layers and configured to extend to a position overlying the IC die.

2. The IC package of claim 1,
wherein the first adhesive layer is disposed onto the substrate at the first plurality of positions, which are respectively located between a side of the substrate and a proximate side of the IC die; and
wherein the second adhesive layer is disposed onto the substrate at the second plurality of positions, which are respectively located between a corner of the substrate and a proximate corner of the IC die.

3. The IC package of claim 1, further comprising:
a thermal interface material (TIM) layer vertically disposed between the IC die and the lid.

4. The IC package of claim 3, wherein the TIM layer, the first adhesive layer, and the second adhesive layer comprise different materials.

5. The IC package of claim 1, wherein the first adhesive layer is disposed onto the substrate in one or more linear patterns that are interspersed between the second adhesive layer.

6. The IC package of claim 1, wherein the first Young's modulus is approximately three orders of magnitude larger than the second Young's modulus.

7. The IC package of claim 1,
wherein the first Young's modulus is in a range of between approximately 5 GPa (gigapascal) and approximately 10 GPa; and
wherein the second Young's modulus is in a range of between approximately 1 MPa (megapascal) and approximately 8 MPa.

8. The IC package of claim 1, wherein the first adhesive layer is separated from the second adhesive layer by spaces that form openings in the IC package located between the lid and the substrate.

9. The IC package of claim 1, further comprising
a plurality of solder balls disposed within an underfill layer located between the IC die and the substrate and configured to prevent CTE mismatch between the IC die and the substrate.

10. An integrated chip (IC) package, comprising:
an integrated chip (IC) die coupled to a substrate by a plurality of electrically conductive bonding structures disposed within an underfill layer configured to prevent CTE mismatch between the IC die and the substrate;
a first adhesive layer having a first Young's modulus and disposed onto the substrate at a first plurality of positions, which are laterally located between a side of the substrate and a proximate side of the IC die; and
a second adhesive layer having a second Young's modulus less than the first Young's modulus and disposed onto the substrate at a second plurality of positions, which are laterally located between a corner of the substrate and a proximate corner of the IC die;
a lid affixed to the substrate by the first and second adhesive layers and configured to extend to a position overlying the IC die; and
a thermal interface material (TIM) layer vertically disposed between the IC die and the lid, wherein the TIM layer and the first or second adhesive layers comprise a same material.

11. The IC package of claim 10, wherein the first adhesive layer is disposed onto the substrate in one or more linear patterns that are interspersed between the second adhesive layer.

12. The IC package of claim 11, wherein the second adhesive layer is disposed onto the substrate in one or more "L" shaped patterns interspersed around a perimeter of the IC die between one of the one or more linear patterns of the first adhesive layer.

13. The IC package of claim 10, wherein the first Young's modulus is approximately three orders of magnitude larger than the second Young's modulus.

14. The IC package of claim 10,
wherein the first Young's modulus is in a range of between approximately 5 GPa and approximately 10 GPa; and
wherein the second Young's modulus is in a range of between approximately 2 MPa and approximately 8 MPa.

15. The IC package of claim 10, wherein the first adhesive layer is separated from the second adhesive layer by spaces that form openings in the IC package located between the lid and the substrate.

16. The IC package of claim 10, wherein the electrically conductive bonding structure comprises a flip-chip solder balls connected between a BEOL metallization layer on the IC die and the substrate.

17. A method of forming an integrated chip (IC) package, comprising:
bonding an integrated chip (IC) die is to a substrate using an electrically conductive bonding structure disposed within an underfill layer configured to prevent CTE mismatch between the IC die and the substrate;
selectively depositing a first adhesive layer onto the substrate at a first plurality of positions surrounding the IC die;
selectively depositing a second adhesive layer, having a second Young's modulus that is less than a first Young's modulus of the first adhesive layer, onto the substrate at a second plurality of positions surrounding the IC die, wherein the second adhesive layer has an 'L' shape comprising two connected orthogonal legs separated from the first adhesive layer by spaces having different sizes; and
bringing a lid into contact with the first and second adhesive layers.

18. The method of claim 17,
wherein the first Young's modulus is approximately three orders of magnitude larger than the second Young's modulus.

19. The IC package of claim 1, further comprising:
a third adhesive layer disposed between the first adhesive layer and the second adhesive layer, wherein the third adhesive layer has a third Young's modulus less than the first Young's modulus and greater than the second Young's modulus.

* * * * *